(12) United States Patent
Roy et al.

(10) Patent No.: US 8,638,535 B2
(45) Date of Patent: Jan. 28, 2014

(54) VERTICAL MOUNT TRANSIENT VOLTAGE SUPPRESSOR ARRAY

(75) Inventors: Kevin P. Roy, West Springfield, MA (US); Richard A. Poisson, Avon, CT (US); Jay W. Kokas, East Granby, CT (US); Edward John Marotta, Longmeadow, MA (US); Robert C. Hoeckele, Granby, CT (US); Luke T. Orsini, Marlborough, CT (US); Marc S. McCloud, Suffield, CT (US); Matthew S. Fitzpatrick, Portland, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 398 days.

(21) Appl. No.: 12/987,219

(22) Filed: Jan. 10, 2011

(65) Prior Publication Data

US 2012/0176716 A1 Jul. 12, 2012

(51) Int. Cl.
*H02H 3/22* (2006.01)

(52) U.S. Cl.
USPC .......................................................... 361/111

(58) Field of Classification Search
USPC .......................................................... 361/117
See application file for complete search history.

(56) References Cited

U.S. PATENT DOCUMENTS

| | | | |
|---|---|---|---|
| 4,751,479 A | 6/1988 | Parr | |
| 5,041,901 A * | 8/1991 | Kitano et al. | 257/779 |
| 5,103,193 A | 4/1992 | Von Bokern | |
| 5,103,289 A * | 4/1992 | Brady | 257/692 |
| 5,142,263 A | 8/1992 | Childers et al. | |
| 5,189,387 A | 2/1993 | Childers et al. | |
| 5,201,855 A | 4/1993 | Ikola | |
| 5,291,375 A * | 3/1994 | Mukai | 361/760 |
| 5,337,216 A * | 8/1994 | McIver | 361/728 |
| 5,367,124 A * | 11/1994 | Hoffman et al. | 174/552 |
| 5,406,119 A * | 4/1995 | Numada | 257/692 |
| 5,528,079 A * | 6/1996 | McIver | 257/698 |
| 5,880,405 A * | 3/1999 | Nakamura et al. | 174/552 |
| 6,441,477 B2 * | 8/2002 | Maeda et al. | 257/696 |
| D466,485 S * | 12/2002 | Maehara et al. | D13/182 |
| 6,664,656 B2 | 12/2003 | Bernier | |
| 7,350,281 B2 | 4/2008 | Schnetker | |
| 7,558,036 B2 | 7/2009 | Wardzala | |
| 7,817,070 B2 | 10/2010 | Games | |
| 7,821,111 B2 * | 10/2010 | Tellkamp | 257/666 |
| 8,274,164 B2 * | 9/2012 | Autry | 257/796 |
| 2005/0006731 A1 * | 1/2005 | O'Shea et al. | 257/666 |
| 2005/0228549 A1 | 10/2005 | Stickling | |
| 2007/0230080 A1 * | 10/2007 | Pozzuoli | 361/111 |
| 2009/0015978 A1 * | 1/2009 | Clark | 361/111 |
| 2009/0045816 A1 * | 2/2009 | Robinson | 324/457 |
| 2009/0254888 A1 * | 10/2009 | Nicholls et al. | 717/129 |
| 2009/0284888 A1 * | 11/2009 | Bartel et al. | 361/118 |
| 2010/0091422 A1 | 4/2010 | Feng et al. | |
| 2010/0109147 A1 * | 5/2010 | Autry | 257/692 |

* cited by examiner

*Primary Examiner* — Rexford Barnie
*Assistant Examiner* — Angela Brooks
(74) *Attorney, Agent, or Firm* — Kinney & Lange, P.A.

(57) ABSTRACT

A system comprises a package with top and bottom surfaces, a plurality of high-power transient voltage suppressors arranged within the package, and a robust lead frame. Each of the transient voltage suppressors has first and second major surfaces substantially perpendicular to the top and bottom surfaces of the package. The lead frame comprises leads connected to the major surfaces of the transient voltage suppressors. Each of the leads has a thickness greater than about 0.015 inches (or 0.381 mm) in a mounting portion, in order to dissipate heat from the transient voltage suppressors and to resist vibration-induced stress on the package.

18 Claims, 5 Drawing Sheets

VERTICAL MOUNT TRANSIENT VOLTAGE SUPPRESSOR ARRAY

BACKGROUND

This invention relates generally to voltage suppression, and specifically to voltage suppressors for lightning-induced transients and other fast, high-power pulses. In particular, the invention concerns a robust transient voltage suppression system capable of high reliability operation for aircraft engine mounted electronics, avionics systems, and other mission-critical electronics applications.

Lightning suppression and related transient voltage control techniques are important to a wide range of electronics applications, including power transmission, telecommunications and transportation. In avionics and related aviation systems, voltage transients pose particular challenges due to the unique environmental exposure conditions, and the relatively serious potential consequences of transient-induced failure modes.

SUMMARY

This invention concerns a transient voltage suppression system. The system comprises a package having top and bottom surfaces, a plurality of transient voltage suppressors, and a robust lead frame. The transient voltage suppressors are arranged vertically between the top and bottom surfaces of the package, with first and second major surfaces substantially perpendicular to the bottom.

The lead frame comprises a plurality of leads connected to the first and second major surfaces of the transient voltage suppressors. Each of the leads has a thickness of at least 0.015 inches (or 0.381 mm) in a mounting portion, in order to dissipate heat from the transient voltage suppressors and to resist vibration-induced stress on the package.

DETAILED DESCRIPTION

Figure 1A:
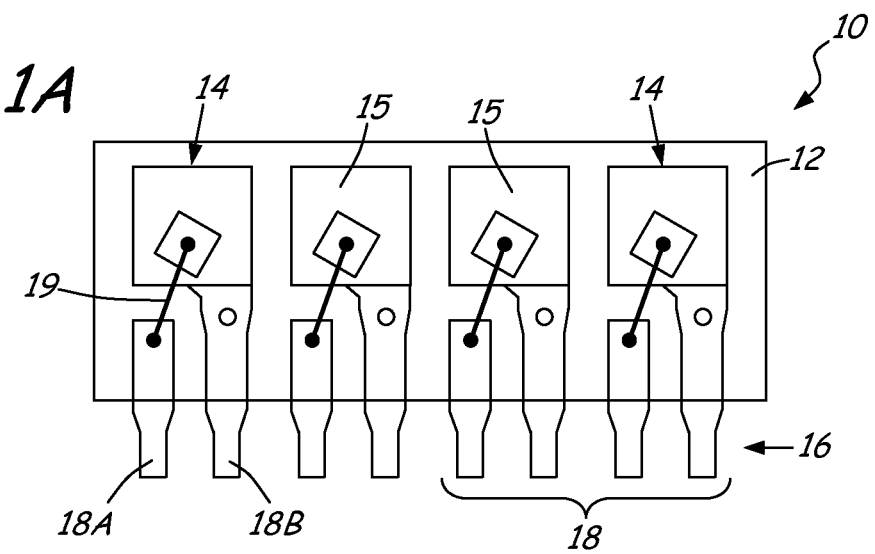
FIG. 1A is a schematic side view of a transient voltage suppression (TVS) system.

FIG. 1A is a schematic side view of transient voltage suppression (TVS) system 10. System 10 comprises package 12, an array of TVS devices 14 comprising individual dies 15, and lead frame 16.

The body of package 12 is typically manufactured from an insulating and heat resistant material such as a plastic polymer or ceramic, which is molded or formed around TVS devices 14 and lead frame 16. Alternatively, package 12 is formed as a shell and TVS dies 15 are attached to lead frame 16 and then inserted into package 12, which is then be filled with a potting compound or other insulating material.

TVS devices 14 comprise semiconductor-based solid state electronics elements or dies 15, which operate as transient voltage suppressors or surge suppressors. Dies 15 are typically formed by thin-film deposition onto a substrate, with individual leads 18 connecting to the major parallel surfaces of each die 15.

In the particular embodiment of FIG. 1A, TVS devices 14 are arranged in one or more rows of four dies 15 each, with each die 15 oriented in a longitudinal sense along the inside of package 12. Alternatively, different numbers of TVS devices 14 are provided, for example between four and twenty-four, and dies 15 are arrayed either longitudinally or transversely within package 12, as described below.

Lead frame 16 comprises a plurality of individual leads or pin electrodes 18. Leads 18 are arranged in pairs 18A, 18B, with leads from each pair connected to the opposite major surfaces of die 15.

As shown in FIG. 1A, leads 18A and 18B extend from the major surfaces of dies 15 to adjacent pin locations along one side of package 12. Individual leads 18A are bonded to the front surface of each die 15 using lead bond or bond wire 19, and leads 18B are bonded to the back.

TVS devices 14 are selected for relatively higher power capacity when used with exposed signal lines subject to direct transient signal sources, and relatively lower capacity for less exposed lines, which are primarily subject to indirectly induced transients. In some embodiments, high-power TVS devices 14 utilize dies 15 with power ratings of 3 kW or more, for example about 3 kW, about 5 kW, about 10 kW or about 15 kW. Alternatively, TVS devices 14 utilize dies 15 with peak power ratings of 2 kW, 1 kW or less.

In lightning suppression and other short-pulse width, high-amplitude applications, TVS devices 14 have a response time of 1-10 μs or less and are capable of peak power dissipation of at least 3 kW without thermal failure, internal sparking or shorting between input and output leads 18. Leads 18 have sufficiently low impedance to provide fast voltage clamping without excessive overshoot, and sufficient current carrying capacity to realize the given power rating and response time under a range of different operating conditions.

The working voltage depends on the desired signal range and expected voltage surge conditions. Depending on embodiment, different TVS devices 14 provide working voltage ranges including, but not limited to, 5 V, 6 V, 9 V, 12 V, 18 V, 20 V, 24 V and 40 V.

Below the working voltage, there is substantially no shunt current across leads 18A and 18B, and signals are passed without substantial damping or attenuation. When a transient or surge exceeds the breakdown potential, as measured across the major surfaces of TVS dies 15, voltage clamping occurs.

The breakdown potential (or clamping voltage) is typically a few percent higher than the working voltage, sometimes 10-20% higher or more.

Voltage clamping is characterized by the rapid turn-on of a shunt current (rise time 1-120 μs or less) as the signal reaches the breakdown threshold. The shunt current dissipates pulse energy and clamps the peak voltage at approximately the breakdown potential, preventing transient spikes from propagating downstream, where they could damage sensitive electronics. System 10 provides this protection in a high-power, space-efficient, multiple-TVS package 12, offering fast, reliable transient suppression for avionics systems and other applications subject to high levels of vibration and temperature-induced stress, as described below.

Figure 1B:
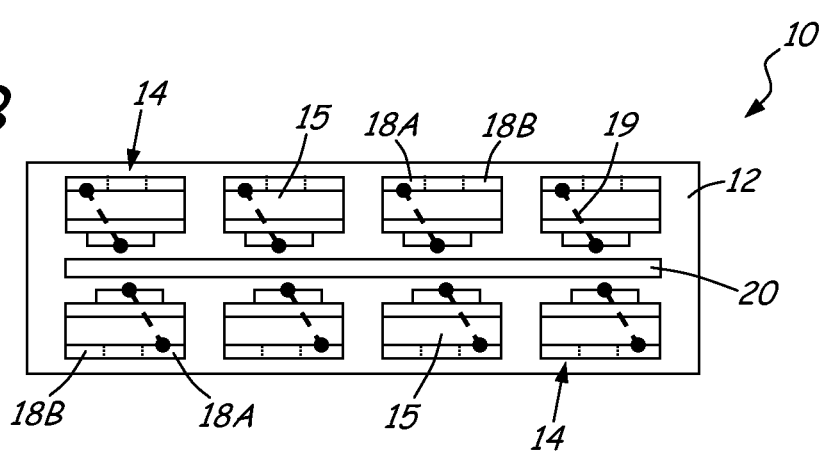
FIG. 1B is a schematic top view of the TVS system.

FIG. 1B is a schematic top view of TVS system 10. In this embodiment, eight individual TVS devices 14 are arranged within package 12, in two rows of four dies 15 each. The rows of dies 15 are separated by spacer layer or insulator 20.

In some embodiments, dies 15 are bonded to opposite surface of spacer 20, and in other embodiments spacer 20 comprises a substrate on which dies 15 are formed. Alternatively, spacer 20 is inserted between two or more rows of TVS dies 15, as shown in FIG. 1B, or between individual TVS devices 14. In further embodiments, the material of package 12 provides an insulating layer or gap between rows of dies 15, or between individual TVS devices 14.

Figure 1C:
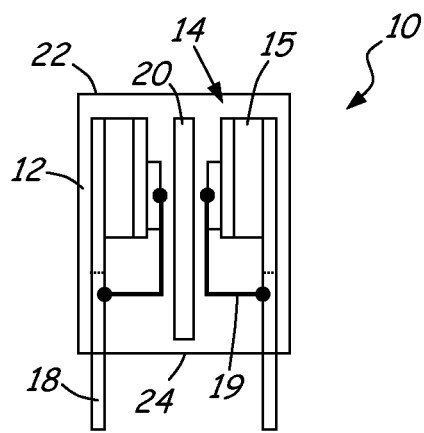
FIG. 1C is a schematic end view of the TVS system.

FIG. 1C is a schematic end view of TVS system 10. TVS devices 14 are vertically oriented within package 12, with the major surfaces of each die 15 substantially perpendicular to top and bottom surfaces 22 and 24.

The vertical orientation of TVS devices 14 substantially reduces surface area requirements for system 10, as compared to horizontally-mounted designs. In particular, the opposing major surfaces of each TVS die 15 are substantially perpendicular with respect to the horizontal plane of package 12, as defined by bottom surface 24. Leads 18 are connected to opposite major surfaces of each TVS die 15, either by soldering or other direct connection, or using lead bonds 19 as described above.

The vertical orientation of TVS devices 14 within package 12 provides substantial size and weight savings for transient voltage suppression system 10, but also raises power management, temperature and vibration issues. In particular, thermal power management is a critical design issue because TVS dies 15 are more closely spaced in system 10 than in other, larger-area and discrete-element designs. Vibration control is also a critical design issue because the vertical array of TVS dies 15 changes the normal mode characteristics of package 12, as compared to discrete and horizontally-mounted embodiments.

These issues are addressed by the particular configuration of TVS elements 14 and lead frame 16 within package 12. As described below, this allows system 10 to be adapted to a range of high vibration, high temperature cycling environments and applications, including, but not limited to, avionics systems for fixed-wing and rotary-wing aircraft.

Figure 2A:
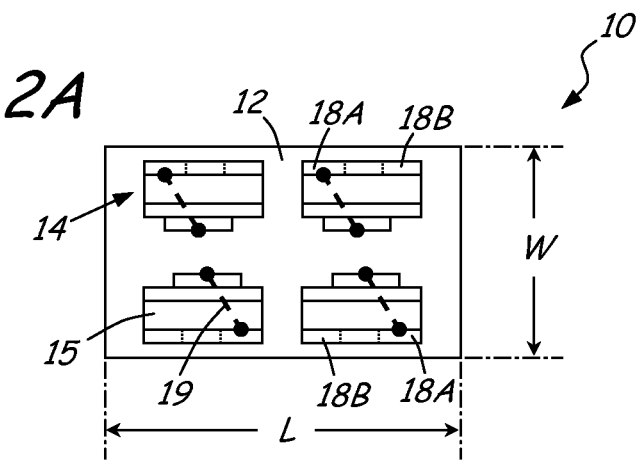
FIG. 2A is a schematic top view of the TVS system, in a four-die embodiment.

FIG. 2A is a schematic top view of TVS system 10, with four TVS devices 14 housed in an eight-pin package 12. Package length L is defined in the longitudinal direction, along the two rows of leads 18, and package width W is defined in the transverse direction, across the two rows of leads 18. Package length L is generally greater than, or at least as great as, package width W.

In the particular embodiment of FIG. 2A, TVS devices 14 are arranged in a two by two matrix of dies 15. Each die 15 is arranged vertically within package 12 and longitudinally with respect to the lead frame; that is, with major surfaces oriented along length L of package 12.

Figure 2B:
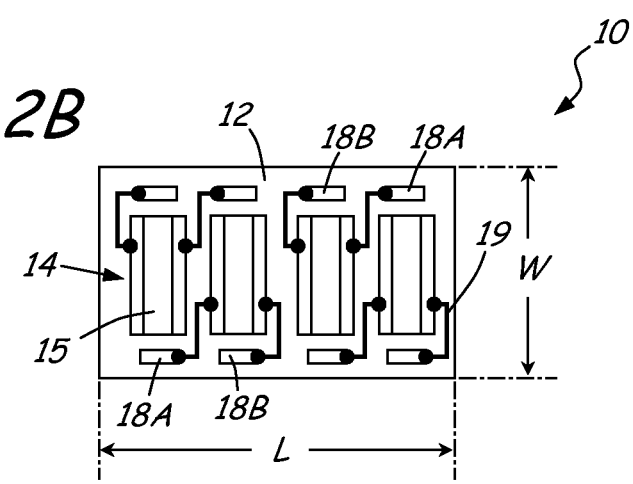
FIG. 2B is a schematic top view of the TVS system, with transverse die orientation.

FIG. 2B is a schematic top view of TVS system 10, with transverse die orientation. In this embodiment, TVS devices 14 are arranged in a single row (or one-dimensional array) of four individual dies 15, with major surfaces substantially perpendicular or transverse to package length L, and oriented across package width W.

Figure 2C:
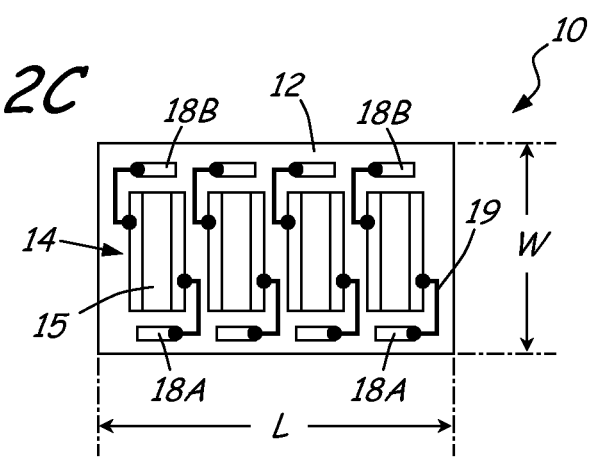
FIG. 2C is a schematic view of the TVS system, with a cross-pin lead configuration.

FIG. 2C is a schematic top view of TVS system 10, with cross-pin lead pairs 18A and 18B. In this embodiment, TVS devices 14 are vertically arranged in a single row or one-dimensional matrix, with transverse orientation for each die 15. In contrast to the adjacent lead configuration of FIGS. 2A and 2B, above, the lead frame is arranged to connect TVS devices 14 across opposing lead pairs 18A and 18B, on opposite sides of package 12.

Cross-pin lead configurations are also applicable to longitudinal die orientations and sixteen-pin packages 12. More generally, TVS system 10 encompasses embodiments with each of the variations described herein, either alone or in combination. In addition, system 10 is not limited to any particular eight or sixteen-pin embodiment of package 12, where the lead frame encompasses different numbers of leads 18, including, but not limited to, four-pin, ten-pin, fourteen-pin, twenty-pin, and twenty-four pin configurations.

Figure 3A:
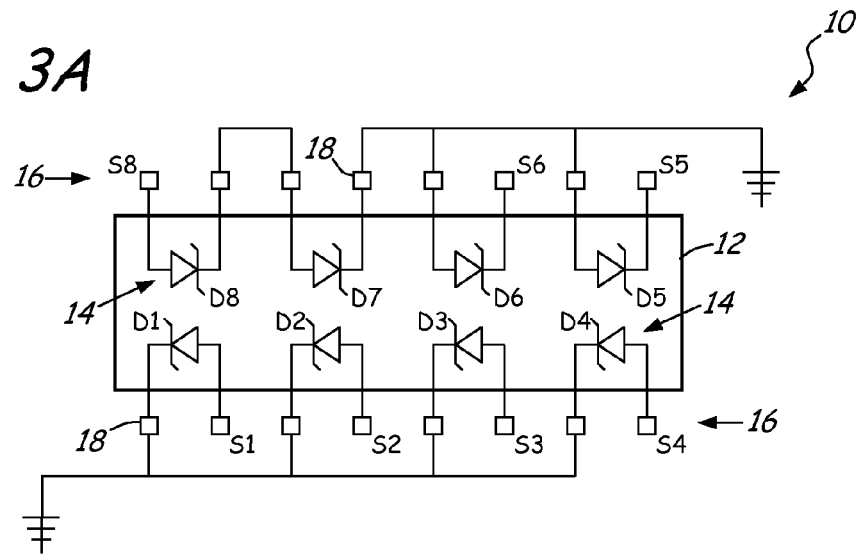
FIG. 3A is a schematic diagram of the TVS system, in a unipolar embodiment.

FIG. 3A is a schematic diagram of TVS system 10, in a unipolar (unidirectional) embodiment. Dies D1-D8 are electrically isolated inside package 12, with first and second major surfaces attached to separate pairs of leads 18 in lead frame 16. Outside package 12, individual leads 18 connect to signals S1-S6 and S8, and to a chassis or ground plane.

Signal lines in engine-mounted electronics and avionics systems must in general be protected from lightning transient induced energy. While shielding and other cable-based mitigation techniques may reduce the induced signal size and pulse magnitude, TVS devices 14 are utilized to suppress remaining transients, shunting current to the ground plane and clamping the signal line voltage to protect downstream electronics.

As shown in FIG. 3A, TVS devices 14 provide clamping capability for either positive or negative voltage surges on signal lines S1-S6 and S8, depending on the signal and ground connections to lead frame 16. In this particular configuration, signal lines S1-S6 are connected in a simple shunt-type arrangement, with each die D1-D6 connecting to a single signal line on one end, and to the ground plane on the other.

Signals S1-S4 are connected in a positive or forward sense across dies D1-D4, and operate at positive voltages below the working voltage. When a lightning surge or other potentially damaging transient exceeds the breakdown potential, current shunts TVS device 14 to ground, clamping the signal voltage dissipating the pulse energy.

Signals S5 and S6 are connected in a backward or negative sense across dies D5 and D6, operating with negative signal amplitudes and shunting current when the signal drops below the negative of the breakdown threshold. Signal S8 is connected across dies D7 and D8 in series, increasing the effective working voltage and reducing heat dissipation in individual TVS devices 14 by dividing the shunt voltage (and power output) across dies D7 and D8.

Figure 3B:
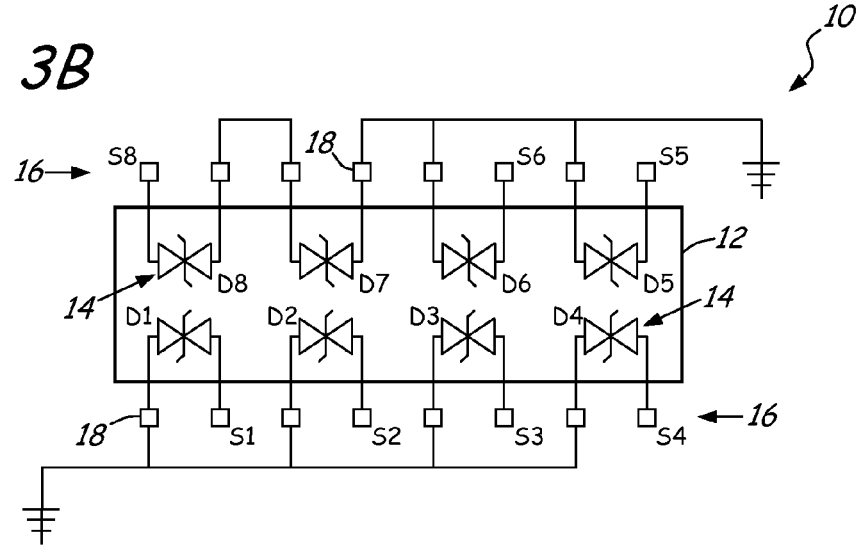
FIG. 3B is a schematic diagram of the TVS system, in a bipolar embodiment.

FIG. 3B is a schematic diagram of TVS system 10, in a bipolar embodiment. In this embodiment, dies D1-D6 are connected individually along signals S1-S6, which operate at either positive or negative working voltages, as described above, and signal S8 is connected across dies D7 and D8 in series.

In both unipolar (FIG. 3A) and bi-polar embodiments (FIG. 3B), system 10 provides voltage clamping and transient suppression for a range of different signal configurations. In particular, system 10 is applicable to both single-ended and differential signal lines S1-S6 and S8, with either voltage-based or current-based signal protocols and both positive and negative signal conventions. Further, dies D1-D8 are electrically isolated within package 12, and the various external connections shown here are merely representative. Different combinations, modifications and changes are possible, including different external wiring configurations. In additional embodiments, package 12 provides a combination of unipolar and bipolar dies D1-D8, or a different number of individual die elements.

Figure 4A:
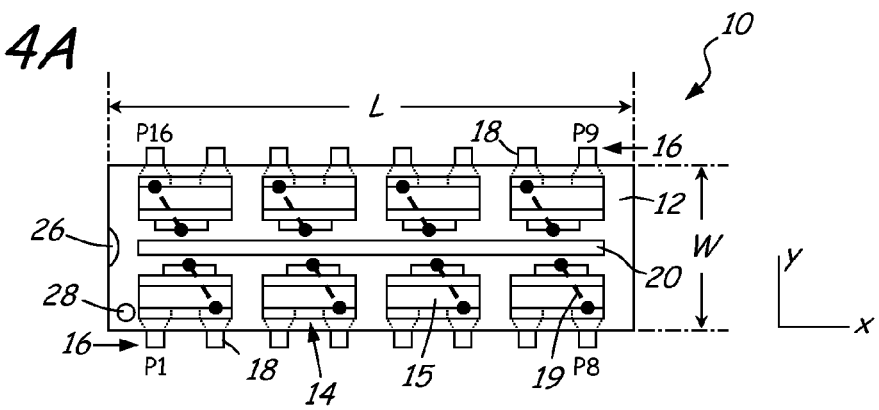
FIG. 4A is a top view of the TVS system, in a sixteen-pin dual in-line package (DIP) configuration with surface-mount leads.

FIG. 4A is a top view of TVS system 10, in a sixteen-pin embodiment with dual in-line package 12. Dual-in line package (DIP) 12 forms a substantially rectangular or oblong housing for the array of TVS devices 14, which are arranged on lead frame 16 with dies 15 in a vertical and longitudinal orientation.

Package 12 is formed of a temperature-resistant insulating material such as a high-temperature thermoplastic or ceramic. The package material is formed or molded about TVS devices 14 and lead frame 16, producing multiple-TVS system 10 with an array of vertically oriented dies 15.

TVS devices 14 are vertically oriented within package 12 to reduce surface area in the horizontal x-y plane. Dies 15 are also independently connected to lead frame 16 using separate leads 18, without internal cross-connections. This limits potential failure modes to individual dies 15, so that one short or other failure does not readily propagate to other TVS devices 14.

In the particular embodiment of FIG. 4A, TVS devices 14 are arranged in two longitudinal rows of four dies 15 each, separated by insulating layer or substrate 20. Alternatively, dies 15 are transversely oriented, as described above, or arranged in a single row or one-dimensional array.

As shown in FIG. 4A, lead frame 16 comprises sixteen individual pin electrodes or leads 18, with pairs of adjacent leads connected across each of the eight TVS devices 14. Leads 18 are numbered in a counterclockwise sense, with pins P1 to P8 arranged sequentially along one side of package 12, and pins P9 to P16 on the other. In some embodiments, pin P1 is indicated by forming notch 26 or dot 28 on the top surface of package 12. In other embodiments, the pin numbering and identification scheme vary.

Figure 4B:
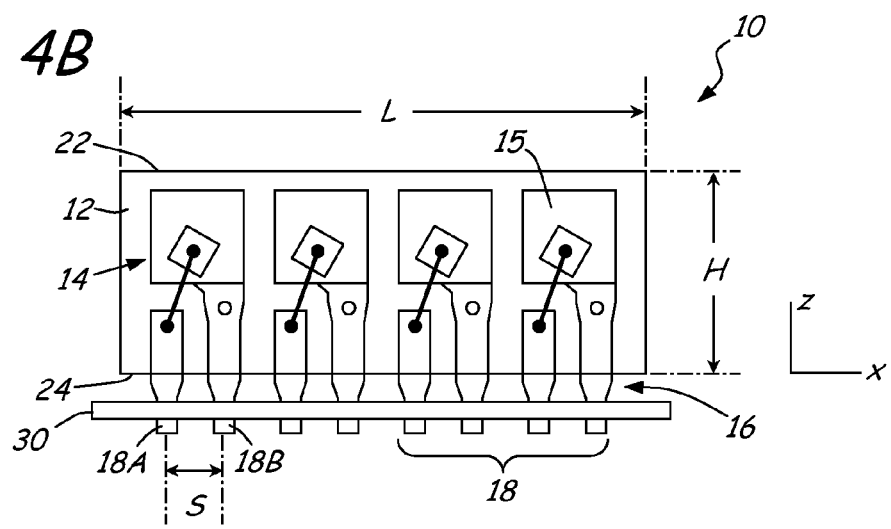
FIG. 4B is a side view of the TVS system, in a through-hole mount configuration.

FIG. 4B is a side view of TVS system 10, in a sixteen-pin DIP embodiment with through-hole electrode frame 16. Leads 18 are connected to opposite surfaces of each TVS device 14, with dies 15 oriented in a longitudinal direction along length L of package 12, between top surface 22 and bottom surface 24. In this longitudinal configuration, the major surfaces of dies 15 are oriented in the vertical x-z plane, as opposed to the vertical y-z plane for transverse embodiments.

Lead pairs 18A, 18B of lead frame 16 extend down through bottom surface (or bottom plane) 24 to adjacent pin locations along one side of package 12. In through-hole or plated-through mounting embodiments, leads 18 extend in a substantially vertical sense (along the z direction) to accommodate a plated-through-hole solder connection to electronics board 30. Alternatively, package 12 is socket-mounted, or leads 18 may be bent for surface mounting as described below with respect to FIG. 4C.

Adjacent lead spacing S is generally uniform, for example with a 0.10 inch or 100 mil (2.54 mm) pitch. Alternatively, the pitch is larger or smaller, including 0.20 inch or 200 mil (5.08 mm) pitch arrangements for larger, typically higher-power TVS devices 14, and 0.05 inch or 50 mil (1.27 mm) "half-pitch" arrangements for smaller, typically lower-power TVS devices 14. Metric pitches are also utilized, including 2.5 mm (0.098 inch), 5 mm (0.197 inch) and 8 mm (0.315 inch), with smaller pitches ranging from 0.5 mm (0.0197 inch) to 1.0 mm (0.039 inch) or 1.25 mm (0.049 inch), and larger pitches ranging up to 10 mm (0.394 inch) or more.

Figure 4C:
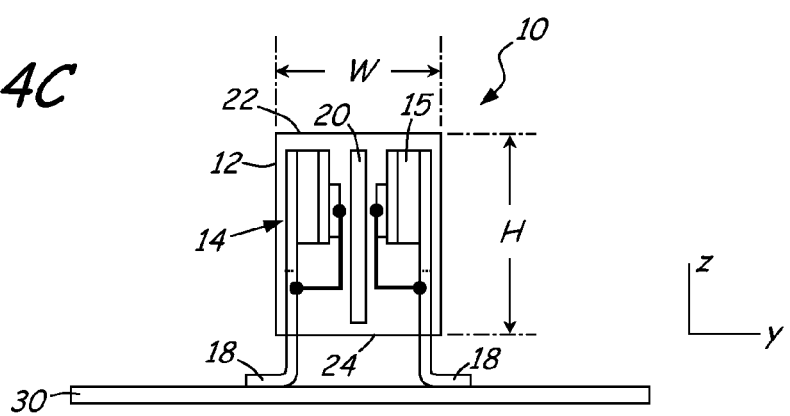
FIG. 4C is an end view of the TVS system, in the surface mount configuration.

FIG. 4C is an end view of TVS system 10, in a surface mount configuration. In this embodiment, pin leads 18 are bent from the vertical (z) direction into the horizontal x-y plane, in order to accommodate surface-mount solder connections to electronics board 30. Vertical TVS elements 14 are shown in a longitudinal orientation, with the major surfaces of dies 15 aligned along package height H in the vertical x-z plane.

Although the absolute physical orientations of TVS elements 14 and dies 15 depend on the location of system 10 within a particular electronics application, the vertical and horizontal planes of FIGS. 4A-4C are defined according to the features of package 12. In particular, TVS devices 14 are vertically oriented with respect to horizontal plane x-y of package 12, as defined by lead frame 16 and top and bottom surfaces 22 and 24.

In addition, the major surfaces of each die 15 are oriented along the vertical z-axis and in the direction of package height H, substantially perpendicular to horizontal plane x-y and top and bottom surfaces 22 and 24. In longitudinal embodiments, the major surfaces of dies 15 are oriented in the vertical x-z plane, along package length L, and in transverse embodiments the major surfaces of dies 15 are oriented in the vertical y-z plane, across package width W. As shown in FIGS. 2A-2C and 4A-4C, these vertical-mount configurations substantially reduce the surface area requirements of system 10 in the horizontal or x-y plane.

System 10 also reduces weight requirements, as compared to an equivalent number of discrete TVS devices. These advantages are important to any application where size and weight envelopes are of concern, including fixed and rotary-wing aircraft and spaceflight applications, where any increase in size and weight results in additional fuel costs and structural loading, while reducing net lifting capability.

In Full Authority Digital Engine (or Electronics) Control (FADEC) systems and related aerospace applications, relative gains can be substantial because a large number of TVS devices 14 are required, sometimes dozens or even a hundred or more. Flight control systems, cockpit interfaces and environmental control systems also utilize relatively large numbers of TVS devices 14, but advantages accrue whether more or fewer individual dies 15 are employed. In particular, existing horizontally-mounted and discrete TVS devices have larger surface area requirements and size and weight costs per individual die 15, and many are unsuitable for high vibration and temperature cycling applications. In general, moreover, height limits are typically less stringent than surface area requirements, because vertical spacing is influenced by other considerations including connector height and heating and cooling flow, while circuit board size and weight are always at a premium.

When multiple TVS devices 14 are provided in a single package 12, however, thermal management and vibration control become critical design issues. To address these concerns, lead frame 16 provides substantially more robust leads 18 than other designs, in order to more effectively dissipate heat from TVS devices 14 and package 12. Leads 18 also provide greater bonding strength in both surface mount and through-hole configurations, and robust lead frame 16 stiffens the mechanical structure of package 12 to resist temperature and vibration-induced stresses in operating environments subject to high levels of vibration and temperature cycling.

Figure 5A:
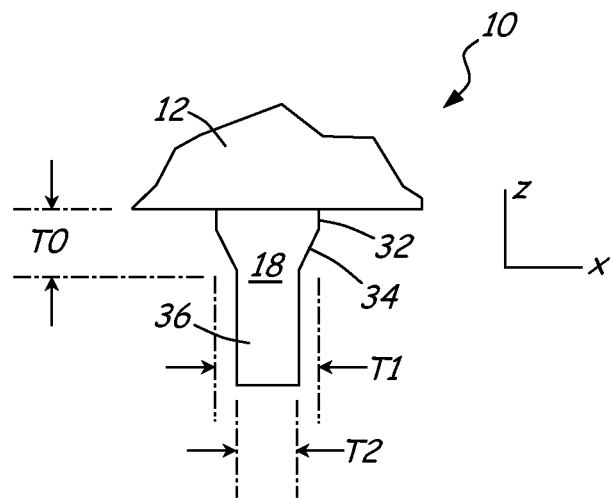
FIG. 5A is an electrode detail for the through-hole configuration of FIG. 4B.

FIG. 5A is an electrode detail for lead 18 of TVS system 10, in a through-hole or plated-through-hole mounting configuration. Lead 18 is typically formed of a conducting material such as copper, with a coating such as hot-dipped tin/lead to prevent oxidization and facilitate solder or socket-type electrical connections. Other low resistivity metals are also used, and the contact surfaces are sometimes plated with conductors such as silver or gold, or left unplated.

In the through-hole embodiment of FIG. 5A, lead 18 is oriented in a substantially vertical sense along the z axis, with top collar portion 32, middle shoulder or neck-down portion 34, and bottom connecting or mounting portion 36. Top collar portion 32 has width T1 along the longitudinal x axis, where width T1 is typically greater than the diameter of the plated-through hole in order to provide washout spacing T0 between the bottom surface of package 12 and the circuit board.

Neck-down portion 34 of lead 18 transitions from width T1 in top collar portion 32 to width T2 in bottom mounting portion 36, where width T2 is typically of smaller diameter to enable plated-through-hole solder connections to a circuit board, or to insert lead 18 into a chip socket.

Figure 5B:
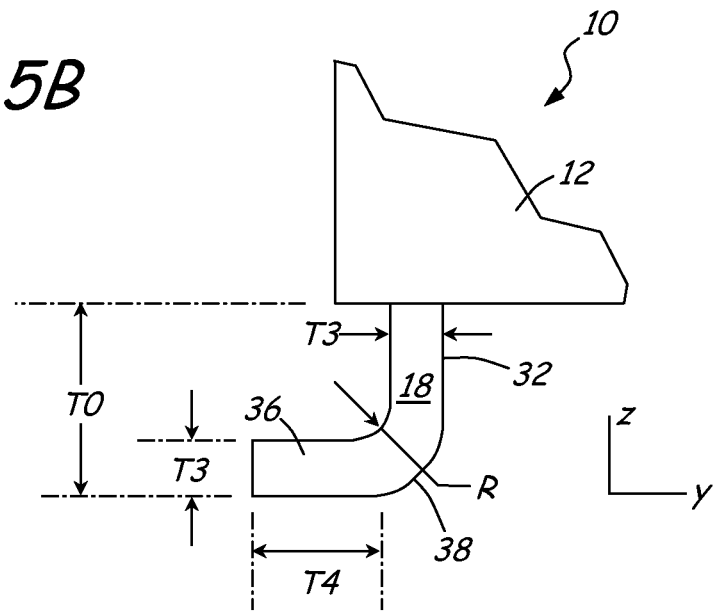
FIG. 5B is an electrode detail for the surface mount configuration of FIG. 4C.

FIG. 5B is an electrode detail for lead 18 of TVS system 10, in a surface mount configuration. In this embodiment, lead 18 has bend 38 below top portion 32, with radius R selected to orient bottom mounting portion 36 in the horizontal (x-y) plane for surface-mount connection to a circuit board. Lead 18 has thickness T3 in mounting portion 36, and surface mount attachment length T4.

In both surface mount technology (SMT) and plated through-hole (PTH) embodiments, connecting leads 18 provide thermal power management and vibration control features. In particular, leads 18 are substantially thicker and more robust than other pin designs, in order to dissipate thermal energy (heat) from TVS elements 14, and to resist vibration and temperature-induced stresses on package 12.

In some examples, lead 18 has width T1 of at least 0.040 inches (or about 1.016 mm) in collar portion 32. Alternatively, lead 18 has collar width T1 of at least 0.050 inches (1.27 mm), or at least 0.060 inches (1.524 mm). Alternatively, lead 18 has width T1 of at least 0.060±0.003 inches (1.524±0.076 mm) in collar portion 32.

Lead 18 has width T2 in mounting portion 36. In some examples, width T2 is at least 0.020 inches (or about 0.508 mm), at least 0.030 inches (0.762 mm), or at least 0.040 inches (1.016 mm). Alternatively, lead 18 has width T2 of at least 0.035±0.003 inches (0.889±0.076 mm) in mounting portion 36.

Lead 18 also has thickness T3 in mounting portion 36, where thickness T3 is transverse to width T2. In some examples, thickness T3 is at least 0.015 inches (or about 0.381 mm), at least 0.020 inches (0.508 mm), or at least 0.030 inches (0.762 mm). Alternatively, lead 18 has thickness T3 of at least 0.020±0.005 inches (0.508±0.127 mm) in mounting portion 36.

Surface-mount attachment length T4 in mounting portion 36 also varies, for example in a range of at least 0.050 inches (or about 1.270 mm) or more. Alternatively, surface-mount attachment length T4 is at least 0.065±0.0325 inches (1.651±0.127 mm).

Depending on embodiment, washout spacing T0 is about 0.030±0.003 inches (or about 0.762±0.076 mm) in plated through-hole configurations, or at least 0.020 inches (0.508 mm). In surface mount embodiments, washout spacing T0 is about 0.100±0.005 inches (2.540±0.127 mm), in order to position bend or curvature region 38 outside of neck-down or transition portion 34 on lead 18, or at least 0.050 inches (1.27 mm).

Peak signal voltage and current depend on the relative exposure of the signal network, shielding configuration, and transient signal induction geometry. Generally, signal lines near a wing, nose, fuselage or rotor surface are subject to larger transients, because these surfaces are subject to direct attachment, and both magnetic and potential coupling occurs. The current path is also a critical variable, and widely-distributed flight control systems may require greater levels of transient voltage protection than other, more limited-area avionics systems, which are restricted to particular sections of the aircraft.

Design considerations are also different for engine-mounted FADEC systems, as typical of fixed-wing aircraft, and cockpit or nacelle-mounted systems, as typical of rotary-wing helicopters. Engine-mounted FADEC systems, for example, are susceptible to aperture coupling and similar induced transients, and cockpit and cabin-mounted systems are susceptible to electromagnetic (Faraday) coupling through windows and other openings in the outer skin of the aircraft.

In addition, composite structural materials tend to provide less inherent shielding than metals. Other relevant effects include high intensity radiated fields (HIRF), electromagnetic pulses (EMP), and other high-energy pulses from non-lightning sources. As a result, TVS management is a highly complex and unpredictable art, in which even relatively minor changes and modifications may have unexpected consequences.

With respect to thermal management, the peak transient pulse voltage may range above 500 V, for example 750 V, 1,000 V, 1,500 V or more. The peak current varies accordingly, for example 500 A, 750 A, 1,000 A, 1,500 A or more, based on a nominal one-ohm signal impedance.

For TVS devices rated for a peak power dissipation of about 3 kW, the shunt current ranges from up to 600 A at a clamping voltage of 5 V, to around 150 A at a clamping voltage of 20 V. To reduce temperature increases under the corresponding thermal loads, leads 18 provide TVS system 10 with the ability to dissipate heat without substantially increasing the temperature of package 12.

Results are based on a single standard 10 µs×1,000 µs test pulse with a rise time of 10 µs to a peak voltage, and a decay time or half-life of 1,000 µs (1 ms). Under these conditions, the temperature increase was no more than 2° C. when up to eight or more TVS elements in a single package 12 were subject to the same test pulse. For higher-magnitude peaks of up to 1,500 V, the corresponding temperature increase may be less than about 5° C.

In some embodiments, the test pulse is repeated at intervals of several milliseconds (e.g., 1-10 ms for up to ten pulses), over a range of about 100 ms. This simulates multiple-pulse transients including multiple-stroke lightning events, where a leader repeatedly breaks and reattaches along a fuselage or other external surface as the aircraft moves through a charge center. In these embodiments, leads 18 provide TVS system 10 with similar thermal management capability, limiting the temperature increase of package 12 to less than 5° C. for 750 V pulses, or less than 10° C. for higher amplitude pulses of up to 1,500 V at peak.

Actual power dissipation also varies based on signal size, package and die configuration, and operating temperature. In an eight-element package 12, for example, with TVS devices 14 rated at 3 kW each, the nominal thermal load may reach 24 kW. At higher temperatures, TVS devices 14 are typically de-rated, and the peak power dissipation may be reduced accordingly. By providing robust leads 18 with increased thermal conductivity, system 10 also lowers the real-time operating temperature of package 12, reducing de-rating effects. This increases the actual or net power capacity under actual operating conditions, and may extend the qualification testing range to higher ambient temperatures.

Leads 18 also provide vibration management by structurally stiffening package 12, and changing the natural mode distribution. In contrast to discrete two-pin and single in-line package (SIP) devices, for example, the arrangement of multiple TVS devices in package 12 suppresses lower-order bending modes, including first-order flexing modes characterized by oscillation in and out of the vertical z axis.

The use of multiple, robust leads 18 also stiffens the overall structure of TVS system 10, increasing other natural mode frequencies, including in-plane modes where package 12 vibrates back and forth in the horizontal (x-y) plane. Based on computer modeling and bench testing, the lowest-order natural vibration mode frequency for package 12 is above (greater than) 1,000 Hz, for example at least 1,500 Hz. In some configurations, robust lead frame 16 shifts the lowest-order mode frequency above 2,000 Hz, for example to at least 2,500 Hz, or at least 3,000 Hz.

Note that these results are difficult if not impossible to predict based on first principles. To obtain these data, a detailed finite element analysis (FEA) of novel system 10 is required, utilizing non-linear systems of partial differential equations to model energy deposition and heat flow for each TVS element, and to determine natural vibration mode frequencies for package 12 with leads 18 at particular operating temperatures in both through-hole and surface mount configurations. Additional data were generated by bench testing prototype systems 10, with up to eight vertically-mounted TVS devices arranged inside each package 12. Modeling and testing of other systems, including discrete TVS devices and horizontally mounted dies, would not produce the same results.

These vibration and thermal management features have utility in a range of applications including fixed-wing and rotary-wing avionics systems, where lightning-induced transients are experienced in high vibration and thermal cycling environments. In particular, the robust configuration of leads 18 provides TVS system 10 and package 12 with improved power management and mechanical performance at temperatures ranging from −55° C. or less to +125° C. or more, and when subject to engine and rotor-induced vibrations at frequencies up to 1,000 Hz, up to 1,500 Hz, or up to 2,000 Hz or more.

While this invention has been described with reference to exemplary embodiments, it will be understood by those skilled in the art that various changes may be made and equivalents may be substituted without departing from the scope of the invention. In addition, modifications may be made to adapt particular situations or materials to the teachings of the invention, without departing from the essential scope thereof. The invention is not limited to the particular embodiments disclosed herein, but includes all embodiments falling within the scope of the appended claims.

The invention claimed is:

1. A system comprising:
a package having a top surface and a bottom surface;
a plurality of high-power transient voltage suppressors arranged vertically within the package, wherein each of the transient voltage suppressors has first and second major surfaces substantially perpendicular to the bottom surface of the package, and each transient voltage protector has a peak power rating of at least 3 kW; and
a robust lead frame comprising leads connected to the first and second major surfaces of the transient voltage suppressors, wherein each of the leads has a thickness of at least 0.015 inches (or 0.381 mm) in a mounting portion to dissipate heat from the transient voltage suppressors and to resist vibration-induced or temperature induced stress on the package, and wherein the leads dissipate heat such that a temperature of the package does not increase by more than 2° C. when each of the transient voltage suppressors is subject to a transient pulse with a 10 μs rise time and a 1,000 μs decay time.

2. The system of claim 1, wherein the mounting portion of each lead extends substantially perpendicular to the bottom surface for through-hole or plated-through mounting of the package.

3. The system of claim 1, wherein each lead comprises a bend proximate the mounting portion and wherein the mounting portion extends substantially parallel to the bottom surface for surface mounting of the package.

4. The system of claim 1, wherein the package has a lowest natural mode vibration frequency above 1,000 Hz.

5. The system of claim 4, wherein the each of the leads has a width of at least 0.032 inches (or 0.813 mm) in the mounting portion.

6. The system of claim 5, wherein the lowest natural mode vibration frequency is above 2,000 Hz.

7. The system of claim 1, wherein the major surfaces of each transient voltage suppressor are oriented longitudinally along a length of the package.

8. The system of claim 1, wherein the major surfaces of each transient voltage suppressor are oriented transversely across a width of the package.

9. The system of claim 1, wherein the transient voltage suppressors are arranged in two rows within the package, the two rows separated by a spacer layer.

10. A transient voltage suppression system comprising: a package having top and bottom surfaces; an array of high power transient voltage suppressors arranged vertically between the top and bottom surfaces, wherein each of the transient voltage suppressors comprises a die having first and second major surfaces substantially perpendicular to the bottom surface of the package; and a robust lead frame comprising leads connected to the first and second major surfaces of each die, wherein each of the leads has a thickness of at least 0.015 inches (or 0.381 mm) in a mounting portion to dissipate heat from the dies, and to resist vibration or temperature-induced stress on the package, wherein a temperature of the package does not increase by more than 2 Â° C. when each of the transient voltage suppressors is subject to a 10 s by 1,000 s pulse with a peak amplitude of at least 750 V.

11. The system of claim 10, wherein each of the transient voltage suppressors has a peak power rating of at least 3 kW.

12. The system of claim 10, wherein the temperature does not increase by more than 5 Â° C. when the pulse is repeated ten times within 100 milliseconds.

13. The system of claim 10, wherein the each of the leads has a width of at least 0.030 inches (or 0.762 mm) in the mounting portion.

14. The system of claim 13, wherein the lowest natural mode vibration frequency is at least 1,500 Hz.

15. The system of claim 10, wherein the major surfaces of each die are oriented longitudinally along a side of package, and wherein the leads connected to the first and second major surfaces of each die extend to adjacent pin positions along the side of the package.

16. The system of claim 10, wherein the package comprises an insulating and heat resistant material formed around the array of high power transient voltage suppressors and the robust lead frame.

17. The system of claim 10, wherein the package comprises a shell and the transient voltage suppressors are attached to the lead frame within the shell, and wherein the shell is filled with one of a potting compound or an insulating material.

18. A transient voltage suppression system comprising:
a package having top and bottom surfaces;
an array of high power transient voltage suppressors with peak power rating of at least 3 kW arranged vertically between the top and bottom surfaces, wherein each of the transient voltage suppressors comprises a die having first and second major surfaces substantially perpendicular to the bottom surface of the package; and
a robust lead frame comprising leads connected to the first and second major surfaces of each die, wherein each of the leads has a thickness of at least 0.015 inches (or 0.381 mm) in a mounting portion to dissipate heat from the dies, and to resist vibration or temperature-induced stress on the package, and wherein the leads dissipate heat such that a temperature of the package does not increase by more than 2° C. when each of the transient voltage suppressors is subject to a transient pulse with a 10 μs rise time and a 1,000 μs decay time.

* * * * *